US010403818B2

(12) United States Patent
Yang et al.

(10) Patent No.: US 10,403,818 B2
(45) Date of Patent: Sep. 3, 2019

(54) METHOD OF FORMING SEMICONDUCTOR DEVICES HAVING THRESHOLD SWITCHING DEVICES

(71) Applicant: Samsung Electronics Co., Ltd., Suwon-si, Gyeonggi-do (KR)

(72) Inventors: Min Kyu Yang, Hwaseong-si (KR); Seong Geon Park, Seongnam-si (KR); Dong Jun Seong, Seongnam-si (KR); Dong Ho Ahn, Hwaseong-si (KR); Jung Moo Lee, Hwaseong-si (KR); Seol Choi, Seoul (KR); Hideki Horii, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 18 days.

(21) Appl. No.: 15/401,474

(22) Filed: Jan. 9, 2017

(65) Prior Publication Data

US 2018/0040818 A1    Feb. 8, 2018

(30) Foreign Application Priority Data

Aug. 3, 2016  (KR) .................. 10-2016-0098811

(51) Int. Cl.
*G11C 13/00* (2006.01)
*H01L 27/24* (2006.01)
*H01L 45/00* (2006.01)

(52) U.S. Cl.
CPC ...... *H01L 45/1641* (2013.01); *G11C 13/0004* (2013.01); *G11C 13/0007* (2013.01); *H01L 27/2427* (2013.01); *H01L 27/2463* (2013.01); *H01L 45/04* (2013.01); *H01L 45/06* (2013.01); *H01L 45/1233* (2013.01); *H01L 45/144* (2013.01); *H01L 45/146* (2013.01); *H01L 45/147* (2013.01)

(58) Field of Classification Search
CPC .......... H01L 29/7869; H01L 29/78696; H01L 29/24; H01L 29/66969; H01L 27/1225; H01L 45/1233
See application file for complete search history.

(56) References Cited

U.S. PATENT DOCUMENTS

| | | | |
|---|---|---|---|
| 7,738,279 B2 | 6/2010 | Slesazeck et al. | |
| 7,889,548 B2 | 2/2011 | Jeong et al. | |
| 7,989,259 B2 | 8/2011 | Kuh et al. | |
| 8,248,844 B2 | 8/2012 | Lim et al. | |

(Continued)

*Primary Examiner* — Zandra V Smith
*Assistant Examiner* — John M Parker
(74) *Attorney, Agent, or Firm* — Harness, Dickey & Pierce, P.L.C.

(57) ABSTRACT

Forming a semiconductor device that includes a memory cell array may include performing a switching firing operation on one or more memory cells of the memory array to cause a threshold voltage distribution associated with threshold switching devices in the memory cells to be reduced. The switching device firing operation may be performed such that the threshold voltage distribution is reduced while maintaining the one or more threshold switching devices in the amorphous state. Performing the switching device firing operation on a threshold switching device may include heating the threshold switching device, applying a voltage to the threshold switching device, applying a current to the threshold switching device, some combination thereof, or the like.

9 Claims, 11 Drawing Sheets

(56) References Cited

U.S. PATENT DOCUMENTS

| | | | |
|---|---|---|---|
| 8,576,619 B2 | 11/2013 | Yoon et al. | |
| 8,830,728 B2 | 9/2014 | Lee et al. | |
| 2008/0106930 A1 | 5/2008 | Kim et al. | |
| 2010/0015785 A1* | 1/2010 | Jeong | G11C 13/0004 438/466 |
| 2013/0270509 A1* | 10/2013 | Hwang | H01L 45/145 257/4 |
| 2015/0162383 A1* | 6/2015 | Hwang | H01L 45/08 257/4 |

* cited by examiner

METHOD OF FORMING SEMICONDUCTOR DEVICES HAVING THRESHOLD SWITCHING DEVICES

CROSS-REFERENCE TO RELATED APPLICATIONS

This application claims benefit of priority under 35 U.S.C. § 119 to Korean Patent Application No. 10-2016-0098811 filed on Aug. 3, 2016 in the Korean Intellectual Property Office, the disclosure of which is incorporated herein by reference in its entirety.

BACKGROUND

1. Field

The present inventive concepts relate to forming semiconductor devices having a threshold switching device.

2. Description of Related Art

In general, memory cells of semiconductor devices, such as a phase-change random access memory (PRAM) or the like, have used a p-n diode or a metal oxide semiconductor (MOS) transistor as a switching device. Recently, to improve a degree of integration of semiconductor devices, instead of a switching device such as a p-n diode or a MOS transistor, a threshold switching device in which a resistance value is rapidly changed at a specific voltage level has been proposed to be included in one or more memory cells of one or more semiconductor devices.

SUMMARY

Some example embodiments of the present inventive concepts may provide a switching device firing process for improving distribution characteristics of threshold switching devices, and a method of forming a semiconductor device using the switching firing process.

According to some example embodiments of the present inventive concepts, a method may include: forming a memory cell array on a semiconductor substrate, the memory cell array including a set of first conductive lines, a set of second conductive lines extending substantially perpendicularly to the first conductive lines, and a set of memory cells between the first conductive lines and the second conductive lines, the memory cells including data storage elements and threshold switching devices in an amorphous phase, each threshold switching device configured to change resistance based on a magnitude of a voltage applied on the threshold switching device at least meeting a threshold voltage associated with the threshold switching device, respectively. The method may further include performing a switching device firing operation on the memory array while maintaining the threshold switching devices in an amorphous state, such that a threshold voltage distribution associated with the threshold switching devices is reduced.

According to some example embodiments of the present inventive concepts, a method, may include forming a plurality of memory cells, each memory cell of the plurality of memory cells including a data storage element and an Ovonic threshold switching device, respectively, the data storage elements and the Ovonic threshold switching devices in an amorphous phase, the Ovonic threshold switching device associated with a threshold voltage, such that the Ovonic threshold switching device is configured to change resistance based on a magnitude of a voltage applied on the Ovonic threshold switching device at least meeting the threshold voltage. The method may further include performing a switching device firing operation on the plurality of memory cells while maintaining the Ovonic threshold switching devices of the plurality of memory cells in an amorphous phase, such that a threshold voltage distribution associated with the Ovonic threshold switching devices is reduced.

According to some example embodiments of the present inventive concepts, a method may include forming a memory cell array including a plurality of threshold switching devices, each threshold switching device configured to change resistance based on a magnitude of a voltage applied on the threshold switching device at least meeting a threshold voltage associated with the threshold switching device, respectively. The method may further include performing a switching device firing operation on the threshold switching devices, such that a threshold voltage distribution associated with the threshold switching devices is reduced. Performing the switching device firing operation may include performing at least one of: heating the threshold switching devices to a temperature that is greater than room temperature and is further associated with a maintained state of non-crystallization in the threshold switching devices, applying a voltage to the threshold switching devices, based on increasing a magnitude of the applied voltage to a target voltage magnitude that is greater than a threshold voltage magnitude associated with the threshold switching devices, maintaining the magnitude of the applied voltage at the target voltage magnitude for a particular period of time, and dropping the magnitude of the applied voltage from the target voltage magnitude, and applying a current to the threshold switching devices, based on increasing a magnitude of the applied current to a target current magnitude, maintaining the magnitude of the applied current at the target current magnitude for a particular period of time, and dropping the magnitude of the applied current from the target current magnitude.

According to some example embodiments of the present inventive concepts, a method may include performing a switching device firing operation on a memory cell, the memory cell including a data storage element and a threshold switching device, the threshold switching device being in an amorphous state, the threshold switching device associated with a threshold voltage, such that the threshold switching device is configured to change resistance based on a magnitude of a voltage applied on the threshold switching device at least meeting the threshold voltage. Performing the switching device firing operation may include adjusting the threshold voltage associated with the threshold switching device while maintaining the amorphous state of the threshold switching device.

BRIEF DESCRIPTION OF DRAWINGS

The above and other aspects, features and other advantages of the present inventive concepts will be more clearly understood from the following detailed description, taken in conjunction with the accompanying drawings, in which.

DETAILED DESCRIPTION

A method of forming a semiconductor device according to some example embodiments will be described with reference to FIG. 1.

Figure 1:
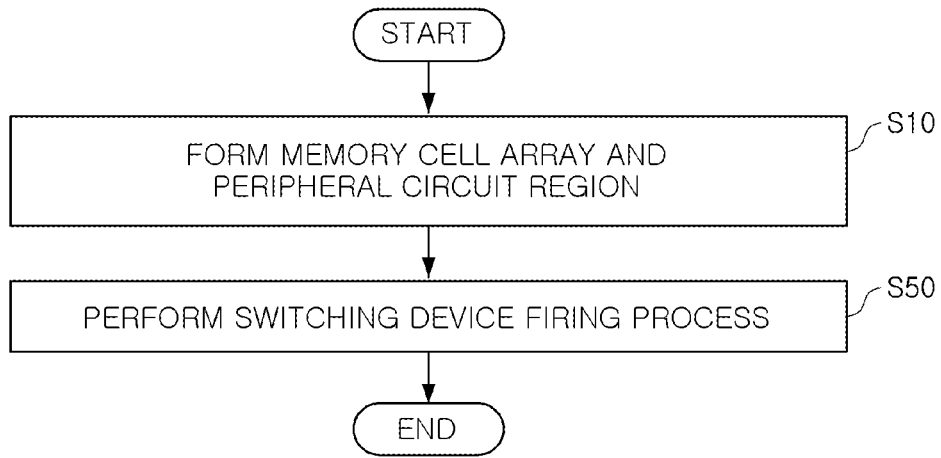
FIG. 1 is a flow chart illustrating a method of forming a semiconductor device according to some example embodiments.

FIG. 1 is a flow chart illustrating a method of forming a semiconductor device according to some example embodiments.

With reference to FIG. 1, the method of forming a semiconductor device according to some example embodiments may include an operation (S10) of forming a memory cell array region and a peripheral circuit region, and an operation (S50) of performing a switching device firing process to improve threshold voltage distribution characteristics of switching devices of the memory cell array.

The memory cell and array region and the peripheral circuit region will be described with reference to FIG. 2.

Figure 2:
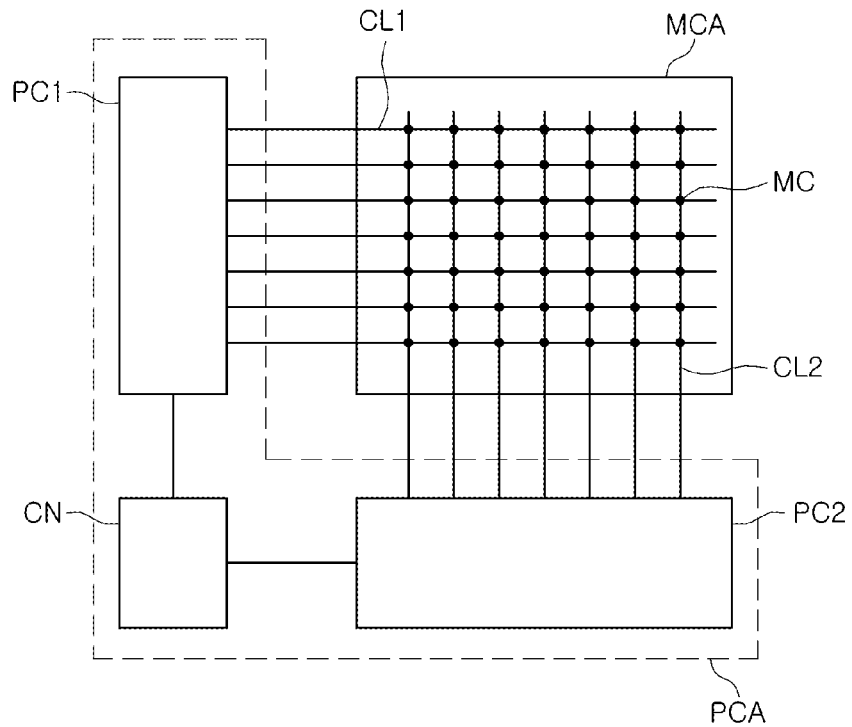
FIG. 2 is a block diagram illustrating a semiconductor device according to some example embodiments.

FIG. 2 is a block diagram illustrating a semiconductor device according to some example embodiments.

With reference to FIG. 2, a peripheral circuit region and a PCA and a memory cell array region MCA, electrically coupled to each other, may be formed. The peripheral circuit region PCA may include a first peripheral circuit region PC1, a second peripheral circuit region PC2, and a control circuit region CN. The memory cell array region MCA may include first conductive lines CL1, second conductive lines CL2 intersecting the first conductive lines CL1, and memory cells MC disposed in a region in which the first conductive lines CL1 and the second conductive lines CL2 intersect. One of the first conductive lines CL1 and the second conductive lines CL2 may be a word line, and the other thereof may be a bit line.

The memory cell array region MCA may be electrically coupled (e.g., directly or indirectly connected) to the first peripheral circuit region PC1 by the first conductive lines CL1, and may be electrically coupled to the second peripheral circuit region PC2 by the second conductive lines CL2.

The first peripheral circuit region PC1 may include an address decoder circuit region, and the second peripheral circuit region PC2 may include a read/write circuit region. The control circuit region CN may control the first peripheral circuit regions PC1 and the second peripheral circuit regions PC2. For example, the first peripheral circuit region PC1 may be configured to be operated in response to control of the control circuit region CN, and the second peripheral circuit region PC2 may be configured to be operated in response to control of the control circuit region CN. The control circuit region CN may control operations of a semiconductor device according to some example embodiments.

The memory cell array region MCA will be described with reference to FIGS. 3A to 4B.

Figure 3A:
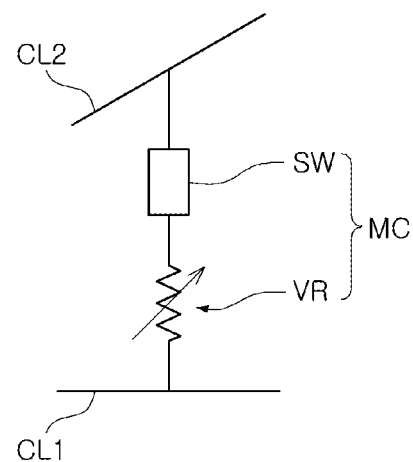
FIG. 3A is a circuit diagram illustrating an example of a memory cell of a semiconductor device according to some example embodiments.
Figure 3B:
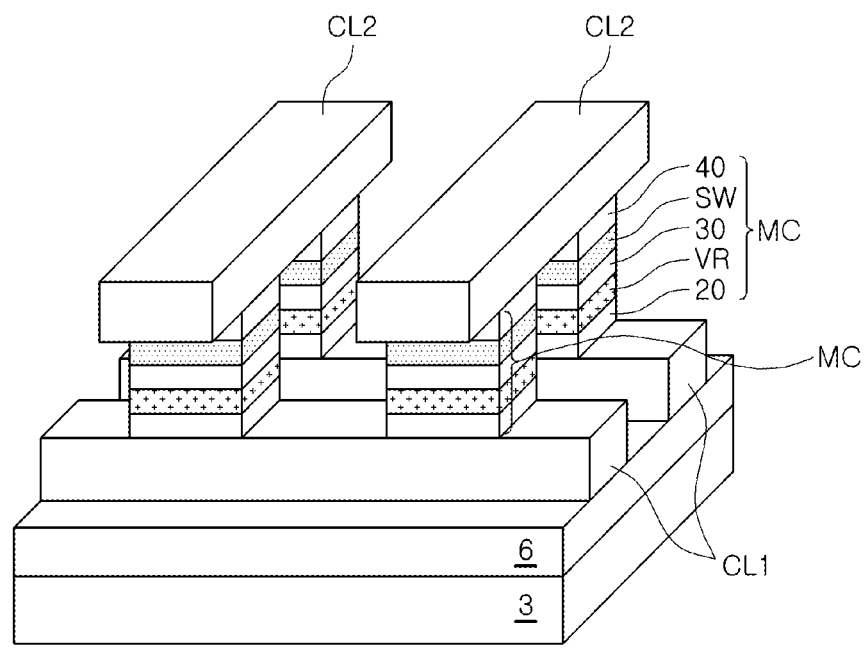
FIG. 3B is a perspective view illustrating an example of a memory cell array region of a semiconductor device according to some example embodiments.
Figure 4A:
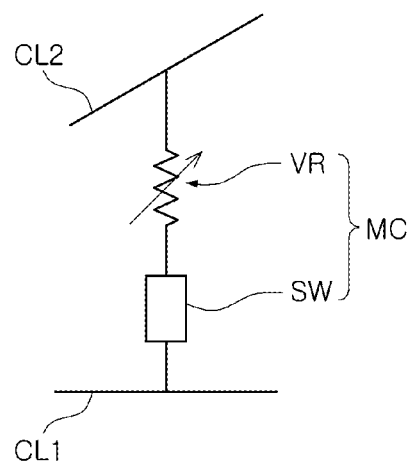
FIG. 4A is a circuit diagram illustrating a modified example of a memory cell of a semiconductor device according to some example embodiments.
Figure 4B:
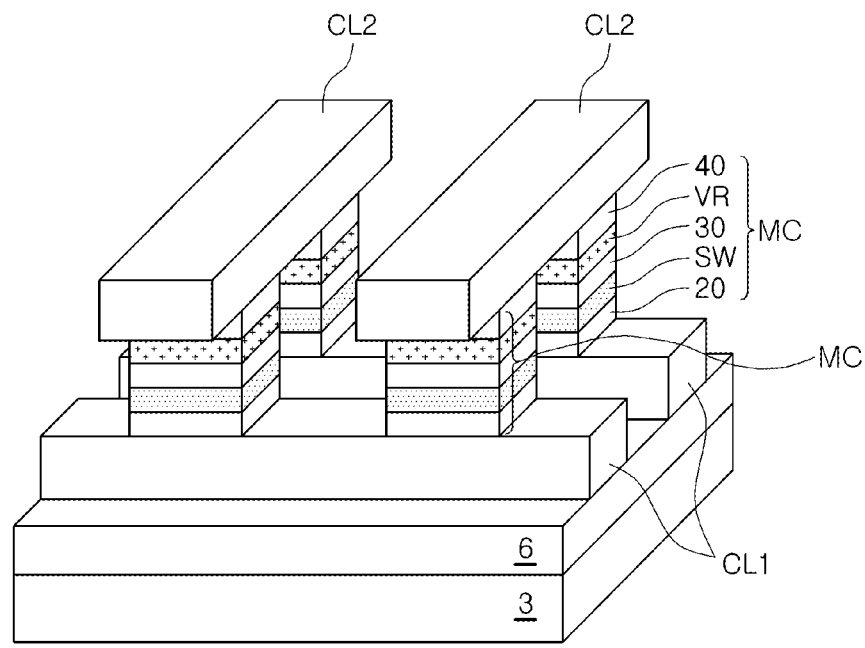
FIG. 4B is a perspective view illustrating a modified example of a memory cell array region of a semiconductor device according to some example embodiments.

FIGS. 3A and 3B are drawings illustrating examples of the memory cell array region MCA, and FIGS. 4A and 4B are drawings illustrating modified examples of the memory cell array region MCA.

With reference to FIGS. 3A and 3B, examples of the memory cell array region MCA will be described. FIG. 3A is a circuit diagram illustrating an example of a memory cell MC of a semiconductor device according to some example embodiments, and FIG. 3B is a perspective view illustrating an example of a semiconductor device according to some example embodiments.

With reference to FIGS. 1, 2, and 3A, each of the memory cells MC of the memory cell array region MCA may include a data storage element VR and a switching device SW between a first conductive line CL1 and a second conductive line CL2. The switching device SW may be disposed between the data storage element VR and the second conductive line CL2. The switching device SW and the data storage element VR may be coupled to each other in series.

Some example embodiments of a semiconductor device including a memory cell MC illustrated in FIG. 3A as described above will be described with reference to FIG. 3B.

With reference to FIGS. 1, 2, 3A, and 3B, a lower insulating layer 6 may be formed on a substrate 3. The substrate 3 may be a semiconductor substrate formed of (e.g., at least partially comprising) a semiconductor material such as silicon or the like. The lower insulating layer 6 may be formed of (e.g., may at least partially comprise) an insulating material such as a silicon oxide or the like.

The first conductive lines CL1 may be formed on the lower insulating layer 6. The first conductive lines CL1 may extend in parallel or substantially in parallel (e.g., parallel within manufacturing tolerances and/or material tolerances). The first conductive lines CL1 may be formed of a conductive material such as doped silicon, a metal (e.g., tungsten (W) or the like), a metallic nitride (e.g., titanium nitride (TiN) or tungsten nitride (WN) or the like), and/or a metal silicide (e.g., tungsten silicide (WSi) or TiSi or the like) or the like.

First electrodes 20, data storage elements VR, second electrodes 30, switching devices SW, third electrodes 40, and the second conductive lines CL2, sequentially stacked on the first conductive lines CL1, may be formed on the first conductive lines CL1, as shown in at least FIG. 3B. The second conductive lines CL2, extending in parallel or substantially in parallel, may vertically overlap the first conductive lines CL1 and may extend in a direction which is perpendicular or substantially perpendicular (e.g., perpendicular within manufacturing tolerances and/or material tolerances). As shown in FIG. 3B, each memory cell MC may vertically overlap both a first conductive line CL1 and a second conductive line CL2, such that the memory cell MC extends along an axis intersected by both the first conductive line CL1 and the second conductive line CL2.

The switching devices SW and the data storage elements VR may configure the memory cells (MC in FIG. 2) of the memory cell array region (MCA in FIG. 2).

In some example embodiments, one or more of the data storage elements VR may be formed of a phase change material (including, for example, a phase change material layer) configured to change between a crystalline state and an amorphous state according to an applied current. For example, as a phase change material which may be used in the data storage elements VR, a chalcogenide-based material including a germanium (Ge) element, a antimony (Sb) element and/or a tellurium (Te) element may be provided. Thus, a semiconductor device including the memory cells MC may be a phase-change random access memory (PRAM). However, some example embodiments are not limited to the data storage elements VR formed of a phase change material. For example, the data storage elements VR may be formed of a material which may be changed to have high resistance by applying an electrical signal, or which may be changed to have low resistance, for example, a perovskite-based material layer or a transition metal oxide layer. In some example embodiments, one or more of the data storage elements VR may include a material whose resistance may be changed by a magnetic field or spin transfer torque.

One or more of the switching devices SW may be a threshold switching device. One or more of the switching devices SW may be an Ovonic threshold switching device configured to have an amorphous phase.

One or more of the switching devices SW may be configured to change resistance (e.g., from about 10,000,000 ohms to less than 1 ohm) based upon a voltage being applied on the switching device SW, where the magnitude of the applied voltage at least meets a particular threshold voltage magnitude (also referred to herein as a "threshold voltage"). Accordingly, the one or more switching devices SW may be referred understood to be associated with the particular threshold voltage.

The switching devices SW may be formed of (e.g., at least partially comprise) a different series of a chalcogenide material from a chalcogenide material that may be used in the data storage elements VR. For example, one or more the data storage elements VR may be formed of a material in which crystalline and amorphous phases may be phase-changed with respect to each other when a semiconductor device is operated (e.g., an alloy of a Ge element, a Sb element or a Te element or the like), and the switching devices SW may be formed of a chalcogenide-based material (e.g., an alloy including an As element and an Se element or the like) which may maintain an amorphous phase when a semiconductor device is operated. A material which may form (e.g., at least partially comprise) the switching devices SW is not limited to an alloy including an As element and an Se element. For example, the switching devices SW may be formed of an alloy including an As element and an S element, and an alloy including an As element and a Te element. The switching devices SW may include an alloy material including at least two or more elements of an As element, an S element, an Se element, a Te element, or a Ge element, or may include an alloy material and an additional element (e.g., a silicon element or a nitrogen element or the like) allowing an amorphous phase to be maintained at a higher temperature than a temperature at which an amorphous phase may be maintained in the case of using the alloy material.

The switching devices SW may be disposed above the data storage elements VR, but some example embodiments are not limited thereto. For example, as illustrated in FIGS. 4A and 4B, the switching devices SW may be disposed below the data storage elements VR, such that the switching devices SW are proximate to the first conductive lines CL1 in relation to the data storage elements VR. The switching devices SW disposed below the data storage elements VR as described above will be described with reference to FIGS. 4A and 4B. FIG. 4A is a circuit diagram illustrating a modified example of a memory cell of a semiconductor device according to some example embodiments, and FIG. 4B is a perspective view illustrating a modified example of a semiconductor device according to some example embodiments.

With reference to FIGS. 1 and 2 as well as FIG. 4A, each of the memory cells MC may include the data storage element VR closer to the second conductive line CL2 than the first conductive line CL1, and the switching device SW closer to the first conductive line CL1 than the second conductive line CL2.

An example of a semiconductor device including the memory cell MC in FIG. 4A will be described with reference to FIG. 4B.

With reference to FIGS. 1, 2, and 4A as well as FIG. 4B, as illustrated in FIG. 3B, the lower insulating layer 6 and the first conductive lines CL1 may be formed above the substrate 3. The first electrodes 20, the switching devices SW, the second electrodes 30, the data storage elements VR, the third electrodes 40, and the second conductive lines CL2, may be formed to be sequentially stacked on the first conductive lines CL1. The switching devices SW and the data storage elements VR of the memory cell MC may be formed of the same materials as those of the switching devices SW and the data storage elements VR described in FIGS. 3A and 3B, such that the switching devices SW of the memory cells MC shown in FIGS. 3A, 3B, 4A, and 4B include a common material and the data storage elements VR of the memory cells MC shown in FIGS. 3A, 3B, 4A, and 4B include a common material.

An operation (S50) of performing a switching device firing process (also referred to herein as a switching device firing operation) configured to improve threshold voltage distribution characteristics of the switching devices SW of the memory cell array region MCA will be described with reference to FIGS. 5 to 18. As described further below with regard to at least FIGS. 19A-B, improving the threshold voltage distribution characteristics of the switching devices SW may include reducing a variation of different threshold voltages associated with the switching devices. Such "improvement" of the threshold voltage distribution may be referred to herein as "reducing" the threshold voltage distribution, reducing threshold voltage variation, some combination thereof, or the like. In some example embodiments, performing a switching device firing process on at least one switching device may include "adjusting" the threshold voltage associated with the at least one switching device (e.g., increasing or decreasing the associated threshold voltage), such that a difference between the associated threshold voltage of the at least one switching device and an associated threshold voltage of at least one other switching device is reduced.

Herein, the switching device firing process performed on a semiconductor device including the memory cells MC described with reference to FIGS. 1, 2, 3A, and 3B, may be performed in the same manner a switching device firing process performed on a the semiconductor device including the modified memory cells MC as described with reference to FIGS. 1, 2, 4A, and 4B. Thus, unless otherwise described, the switching device firing process described with reference to FIGS. 1, 2, 3A, and 3B as well as FIG. 5 to FIG. 18 may be understood to be performed on the semiconductor device including the memory cells MC, which are modified, described with reference to FIGS. 1, 2, 4A, and 4B.

Some example embodiments of the switching device firing process will be described with reference to FIGS. 1, 2, 3A, and 3B as well as FIG. 5.

Figure 5:
FIG. 5 is a drawing illustrating an example of a method of forming a semiconductor device according to some example embodiments.

With reference to FIGS. 1, 2, 3A, and 3B as well as FIG. 5, the switching device firing process S50 may include performing a switching device baking process 100 that includes applying heat from an external heat source to the switching devices SW of the memory cells MC (e.g., "heating" the switching devices SW). The switching device baking process 100 may be performed at a temperature of about 150° C. or less, such that the switching devices SW are heated to a temperature of about 150° C. or less and further such that the switching devices SW in an amorphous phase are not crystallized. The switching device baking process 100 may be performed at a temperature of about 100° C. to about 150° C., such that the switching devices SW are heated to a temperature of about 100° C. to about 150° C.

The switching devices SW whose threshold voltage distribution characteristics are improved in the switching device firing process may maintain an amorphous phase. In other words, performing the switching device firing process on the switching devices SW may configure the switching devices SW to maintain an amorphous phase.

With reference to FIGS. 6 to 10, modified examples of a switching device firing process including applying a voltage to the switching devices SW to improve threshold voltage distribution characteristics of the switching devices SW, will be described.

Figure 6:
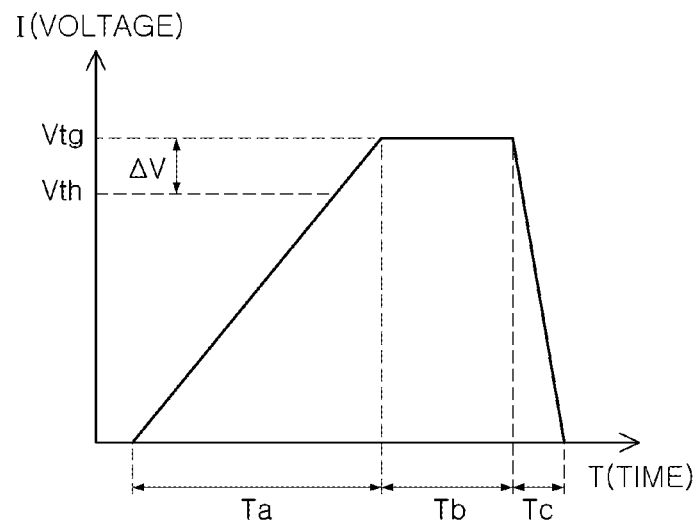
FIG. 6 is a drawing illustrating a modified example of a method of forming a semiconductor device according to some example embodiments.

With reference to FIGS. 1, 2, 3A, and 3B as well as FIG. 6, the applying a voltage to the switching devices SW may include gradually or linearly increasing a level of a voltage from 0V to a target voltage level Vtg over a first period of time Ta in the switching devices SW, maintaining the voltage at the target voltage level Vtg for a second period of time Tb, and dropping the level of the voltage over a third period of time Tc. As shown in at least FIG. 6, the target voltage level Vtg may be greater than the threshold voltage level Vth. As referred to herein a voltage "level" may also be referred to as a voltage "magnitude." As also referred to herein, the adjusting of a voltage level with regard to applying a voltage to the switching devices SW will be understood to refer to adjusting a voltage level and/or voltage magnitude of a voltage applied to one or more switching devices SW.

In the first period of time to the third time Ta, Tb, and Tc, the applying a voltage to the switching devices SW may include applying a positive voltage to the second conductive lines CL2, and applying a ground voltage or 0V to the first conductive lines CL1.

In some example embodiments, the target voltage level Vtg may be a voltage having a level (e.g., magnitude of voltage) higher than that of a threshold voltage Vth of the switching devices SW by Δ. For example, the target voltage level Vtg may be a voltage having a level higher than that of the threshold voltage Vth of the switching devices SW by about 1% to about 20%.

In some example embodiments, to significantly reduce the occurrence of a charging effect that may degrade the switching devices SW, a rising time required to increase a voltage to the target voltage level Vtg, in other words, the first period of time Ta, may be longer than a falling time to drop a voltage from the target voltage level Vtg, in other words, the third period of time Tc. For example, the first period of time Ta may be a time ("duration") equal or substantially equal (e.g., equal within manufacturing tolerances and/or material tolerances) to about 2 times to about 100 times the duration of the third period of time Tc.

For the first period of time Ta, the applying a voltage to the switching devices SW may include gradually or linearly increasing a level of a voltage applied to the switching devices SW to the target voltage level Vtg, but some example embodiments is not limited thereto. A modified example of a method of applying a voltage to the switching devices SW for the first period of time Ta will be described with reference to FIG. 7.

Figure 7:
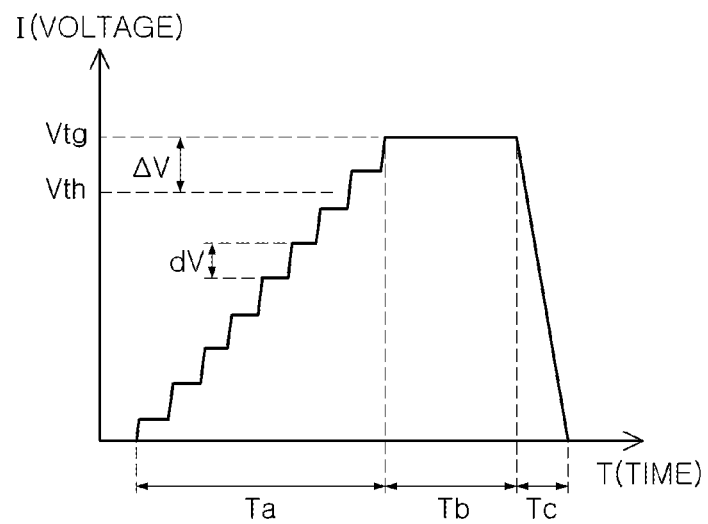
FIG. 7 is a drawing illustrating a different modified example of a method of forming a semiconductor device according to some example embodiments.

With reference to FIG. 7, the applying a voltage to the switching devices SW may include increasing a level of a voltage applied to the switching devices SW to the target voltage level Vtg in stages (e.g., incrementally, step-wise, etc.) during the first period of time Ta in the switching devices SW, maintaining the voltage at the target voltage level Vtg during the second period of time Tb, and dropping the level of the voltage during the third period of time Tc. Each "stage" in voltage application may include increasing the magnitude of the applied voltage by a differential voltage magnitude dV. In some example embodiments, the magnitude of the differential voltage may be the same or substantially the same as Δ.

During the switching device firing process, an operation pulse may be applied to the switching devices SW. When a voltage is increased for the first period of time Ta, a pulse height is increased in stages, 2 or more times, to reach the target voltage level Vtg. Thus, overshoot in applied voltage magnitude which may occur when a voltage is applied may be significantly reduced.

In some example embodiments, applying a voltage to a switching device includes applying a voltage having a magnitude at which a polarity is opposite to that of the applied voltage at the target voltage magnitude to the switching device, before the magnitude of the applied voltage is increased to the target voltage magnitude that is greater than the threshold voltage magnitude associated with the threshold switching device. With reference to FIGS. 1, 2, 3A, and 3B as well as FIG. 8, the applying a voltage to the switching devices SW may include applying a positive voltage pulse to the switching devices SW, after a negative voltage pulse Vn is applied to the switching devices SW to reduce discharge of the data storage elements VR. For example, applying the negative voltage Vn to the first conductive lines CL1 while applying a ground GND or 0V to the second conductive lines CL2 in the switching devices SW, subsequently applying a positive target voltage level Vtg to the second conductive lines CL2, and applying a ground voltage or 0V to the first conductive lines CL1, may be included therein.

In some example embodiments, the positive target voltage level Vtg applied to the second conductive lines CL2 may be the same voltage as the target voltage level Vtg described with reference to FIG. 6.

In some example embodiments, a voltage applied to the first conductive lines CL1 to apply a negative voltage to the switching devices SW may be lower than the target voltage level Vtg applied to the switching devices SW.

In some example embodiments, a magnitude of a voltage applied to the first conductive lines CL1 to apply a negative voltage Vn to the switching devices SW may be the same as a magnitude of the threshold voltage Vth of the switching devices SW. In some example embodiments, a magnitude of a voltage applied to the first conductive lines CL1 to apply a negative voltage to the switching devices SW may be less than a magnitude of the threshold voltage Vth of the switching devices SW.

According to the switching device firing process described above, before the target voltage level Vtg is applied to the switching devices SW, a negative voltage Vn is applied to the switching devices SW to reduce an amount of electrons inside the switching devices SW in advance. Thus, the negative voltage Vn may be applied to the switching devices SW in advance, thereby preventing degradation of the switching devices SW, which may occur when the target voltage level Vtg is applied to the switching devices SW.

Figure 8:
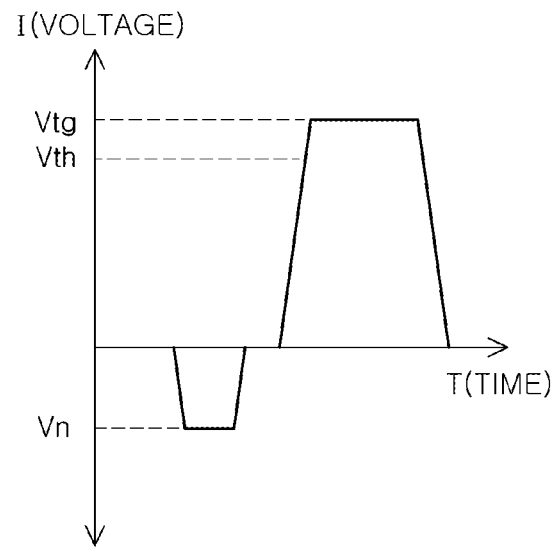
FIG. 8 is a drawing illustrating a different modified example of a method of forming a semiconductor device according to some example embodiments.
Figure 9:
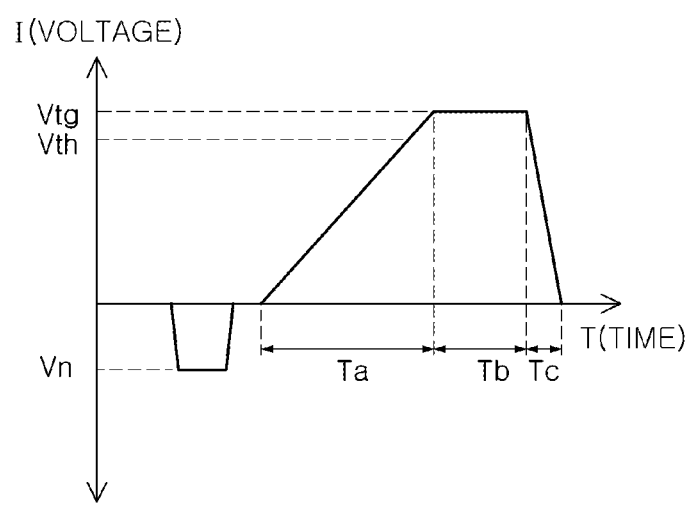
FIG. 9 is a drawing illustrating a different modified example of a method of forming a semiconductor device according to some example embodiments.

With reference to FIGS. 1, 2, 3A, and 3B as well as FIG. 9, the applying a voltage to the switching devices SW may include increasing a level of a voltage to the target voltage level Vtg for the first period of time Ta to the switching devices SW, maintaining the voltage at the target voltage level Vtg for the second period of time Tb, and dropping the level of the voltage for the third period of time Tc, as described in FIG. 6, in the switching devices SW, after applying the negative voltage pulse Vn as described with reference to FIG. 8, to the switching devices SW.

Figure 10:
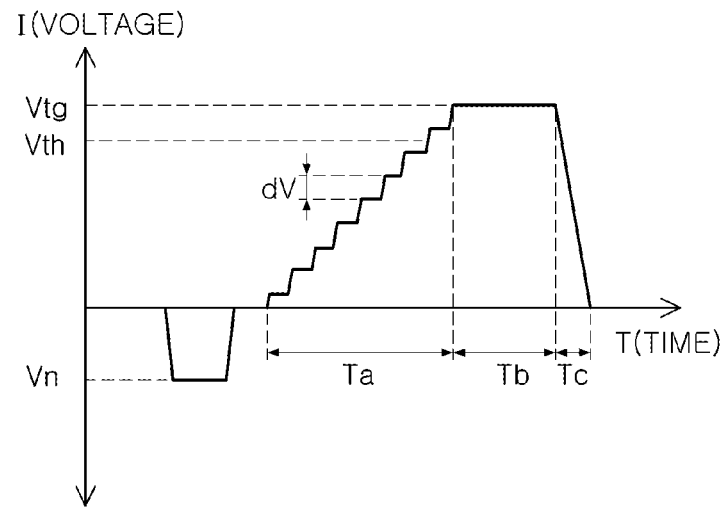
FIG. 10 is a drawing illustrating a different modified example of a method of forming a semiconductor device according to some example embodiments.

With reference to FIGS. 1, 2, 3A, and 3B as well as FIG. 10, the applying a voltage to the switching devices SW may include increasing a level of a voltage to the target voltage level Vtg in stages of differential voltage dV for the first period of time Ta to the switching devices SW, maintaining the voltage at the target voltage level Vtg for the second period of time Tb, and dropping the level of the voltage for the third period of time Tc, as described with reference to FIG. 7, in the switching devices SW, after applying the negative voltage pulse Vn as described with reference to FIG. 8, to the switching devices SW. In some example embodiments, the voltage level may be incrementally increased in stances having differential voltages dV of different magnitudes, respectively. For example, a first stage of voltage level increase may have a differential voltage dV and a second stage of voltage level increase may have a differential voltage that is 2×dV.

Different modified examples of the switching device firing process including the applying of a current to the switching devices SW to improve threshold voltage distribution characteristics of the switching devices SW, will be described with reference to FIGS. 11 to 15.

Figure 11:
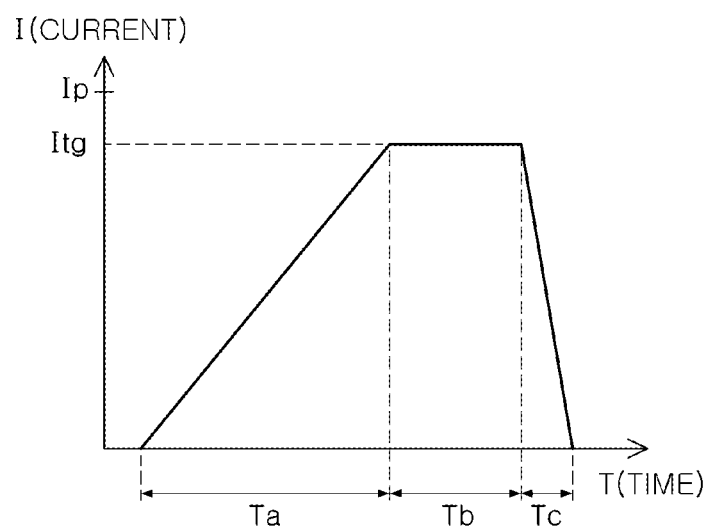
FIG. 11 is a drawing illustrating a different modified example of a method of forming a semiconductor device according to some example embodiments.

With reference to FIGS. 1, 2, 3A, and 3B as well as FIG. 11, the applying of a current to the switching devices SW may include gradually or linearly increasing a level of a current to a target current level Itg for the first period of time Ta, maintaining the current at the target current level Itg for the second period of time Tb, and dropping the level of the current for the third period of time Tc. As referred to herein a current "level" may also be referred to as a current "magnitude." As also referred to herein, the adjusting of a current level with regard to applying a current to the switching devices SW will be understood to refer to adjusting a current level and/or current magnitude of a current applied to one or more switching devices SW.

In some example embodiments, the current at the target current level Itg may be a current having a level lower than a maximum current level Ip in which the switching devices SW are not phase-changed, and may be a current required for switching the memory cells MC including the switching devices SW and the data storage elements VR.

In some example embodiments, when the data storage elements VR are formed of a phase change material, the target current level Itg may be a current associated with firing, heating, etc. the data storage elements VR without causing a change of phase with regard to the switching devices SW, for example, a current causing a change of phase with regard to the data storage elements VR. Thus, while threshold voltage characteristics of the switching devices SW are improved, distribution characteristics of the data storage elements VR may be improved.

A rising time associated with increasing an applied current to the target current level Itg, in other words, the first period of time Ta may be longer than a falling time to drop an applied current from the target current level Itg, in other words, the third period of time Tc. The duration of the first period of time Ta may be about 2 times to about 100 times the duration of the third period of time Tc.

Figure 12:
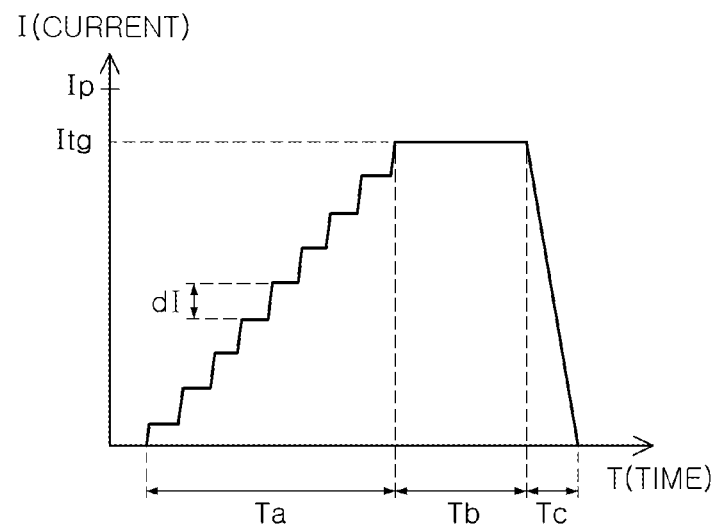
FIG. 12 is a drawing illustrating a different modified example of a method of forming a semiconductor device according to some example embodiments.

A current is gradually or linearly increased during the first period of time Ta to apply a current to the target current level Itg in the switching devices SW, but some example embodiments are not limited thereto. For example, as illustrated in FIG. 12, a current may be increased by stages of differential current dI during the first period of time Ta in the switching devices SW to apply a current to the target current level Itg.

Figure 13:
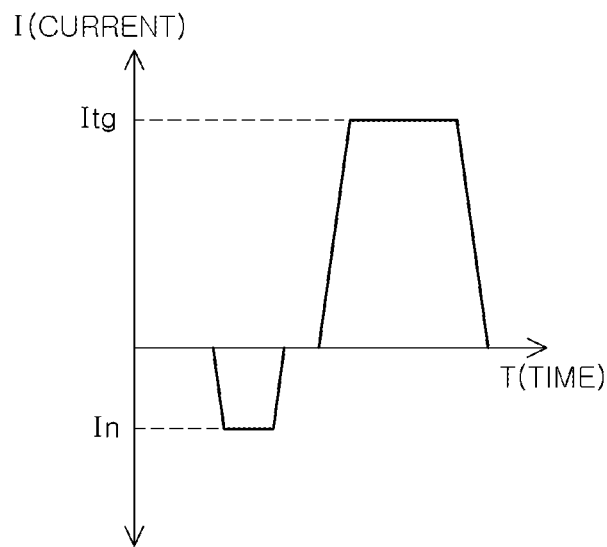
FIG. 13 is a drawing illustrating a different modified example of a method of forming a semiconductor device according to some example embodiments.
Figure 14:
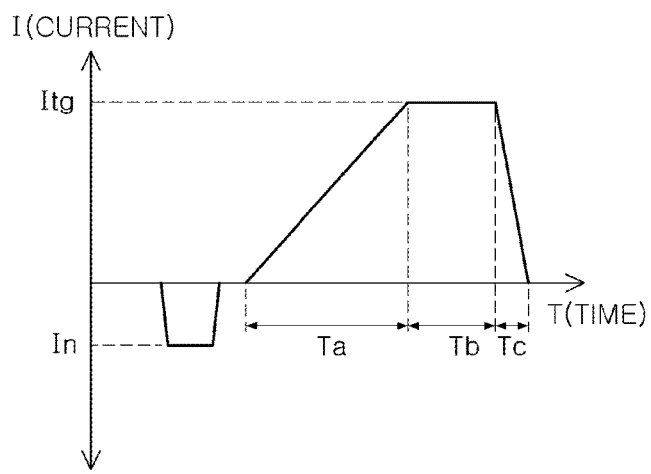
FIG. 14 is a drawing illustrating a different modified example of a method of forming a semiconductor device according to some example embodiments.
Figure 15:
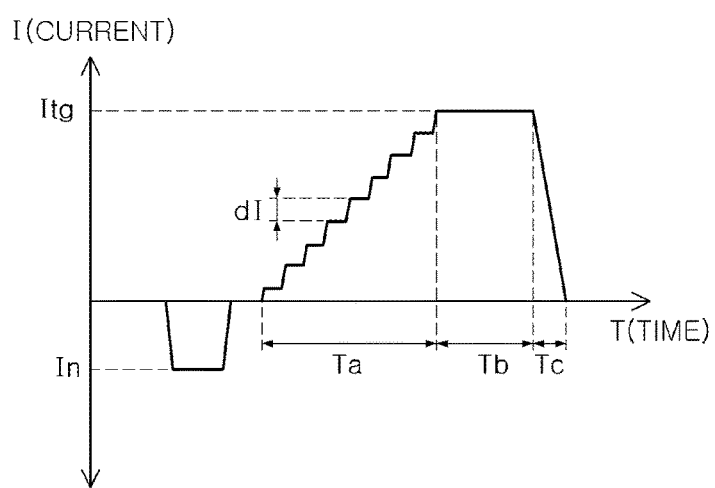
FIG. 15 is a drawing illustrating a different modified example of a method of forming a semiconductor device according to some example embodiments.

With reference to FIGS. 13 to 15, a switching device firing process capable of improving threshold voltage distribution characteristics of the switching devices SW, by applying currents in opposite directions to the switching devices SW, will be described.

With reference to FIGS. 1, 2, 3A, and 3B as well as FIG. 13, the applying of a current to the switching devices SW may include applying a first current In, which may include a negative current pulse, flowing in a first direction to the switching devices SW, and subsequently applying a positive current (which may include a positive current pulse) at the target current level Itg flowing in a second direction opposite to the first direction to the switching devices SW. The first direction may be a direction from the first conductive lines CL1 to the second conductive lines CL2, and the second direction may be a direction from the second conductive lines CL2 to the first conductive lines CL1.

With reference to FIGS. 1, 2, 3A, and 3B as well as FIG. 14, the applying of a current to the switching devices SW may include applying the first current In as described with reference to FIG. 13 to the switching devices SW, and subsequently applying a current flowing in an opposite direction to that of the first current In to the switching devices SW, as described with reference to FIG. 11. For example, gradually or linearly increasing a level of a current to the target current level Itg for the first period of time Ta in the switching devices SW, maintaining the current at the target current level Itg for the second period of time Tb, and dropping the target current level Itg for the third period of time Tc, as described with reference to FIG. 11, after applying the first current In to the switching devices SW, may be included therein.

With reference to FIGS. 1, 2, 3A, and 3B as well as FIG. 15, the applying a current to the switching devices SW may include increasing a level of a current by stages of differential current dI to the target current level Itg for the first period of time Ta in the switching devices SW as described with reference to FIG. 12, maintaining the current at the target current level Itg for the second period of time Tb, and dropping the target current level Itg current for the third period of time Tc, after applying the first current In as described with reference to FIG. 13 in the switching devices SW.

Figure 16:
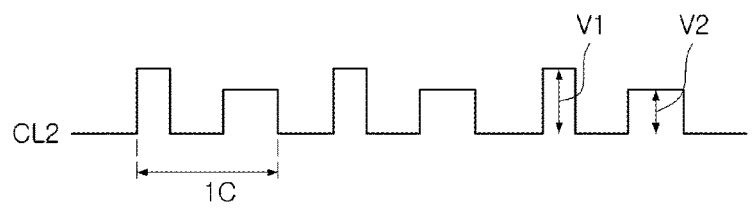
FIG. 16 is a drawing illustrating a different modified example of a method of forming a semiconductor device according to some example embodiments.

With reference to FIG. 16, the switching device firing process capable of improving threshold voltage distribution characteristics of the switching devices SW by applying a voltage to the switching devices SW will be described.

With reference to FIGS. 1, 2, 3A, and 3B as well as FIG. 16, a different modified example of the switching device firing process may include alternately and repeatedly applying a first voltage V1 and a second voltage V2 having different magnitudes to the second conductive lines CL2.

The alternately and repeatedly applying the first voltage V1 and the second voltage V2 having different magnitudes to the second conductive lines CL2 may include repeatedly applying the first and second voltages V1 and V2 in multiple cycles ("voltage cycles"), as a sequential application of the first voltage V1 and the second voltage V2 is one cycle ("voltage cycle") 1C. When the first voltage V1 and the second voltage V2 having different magnitudes are alternately and repeatedly applied to the second conductive lines CL2, 0V may be applied to the first conductive lines CL1. The first voltage level V1 may be higher (e.g., greater magnitude of voltage) than the threshold voltage level Vth of the switching devices SW, and the second voltage level V2 may be lower than the first voltage V1 level. The switching devices SW may maintain anamorphous phase.

In some example embodiments, one of the first voltage V1 and the second voltage V2 may be a voltage associated with configuring the data storage elements VR to be in a low resistive state, and the other one thereof may be a voltage associated with configuring the data storage elements VR to be in a high resistive state.

Figure 17A:
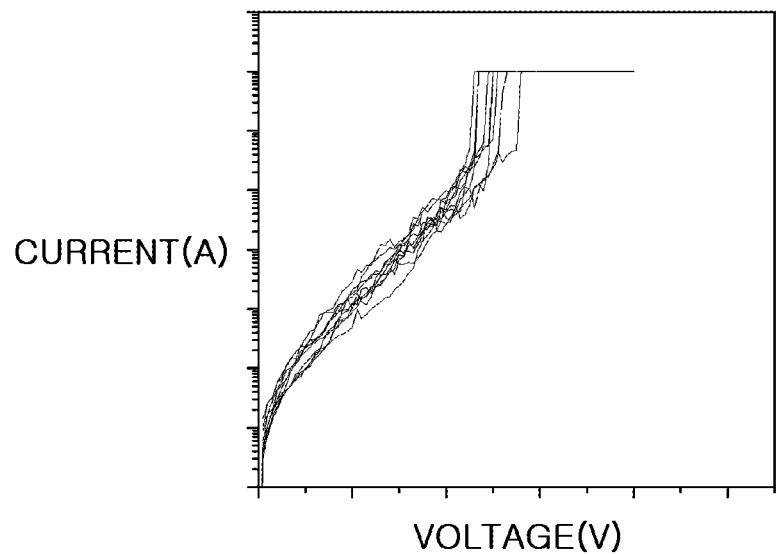
FIG. 17A is a graph illustrating current-voltage characteristics of a threshold switching device, to which a threshold device firing process of a method of forming a semiconductor device according to some example embodiments is not applied.
Figure 17B:
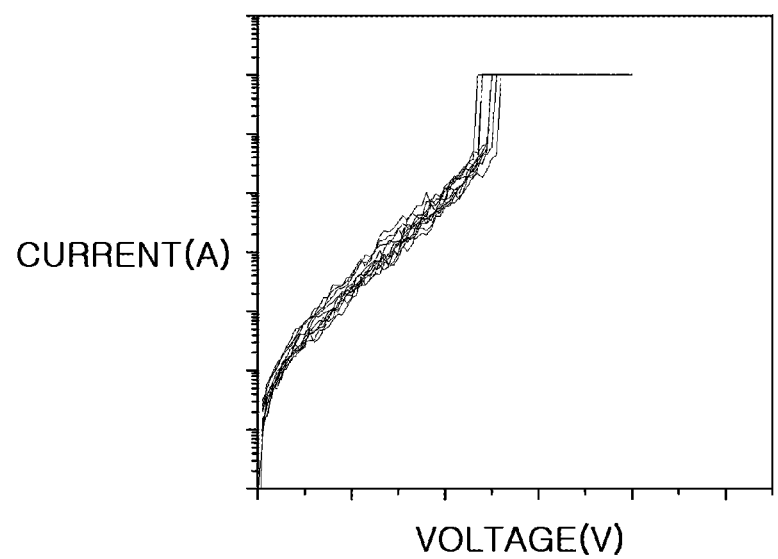
FIG. 17B is a graph illustrating current-voltage characteristics of a threshold switching device, to which a threshold device firing process of a method of forming a semiconductor device according to some example embodiments is applied.

FIG. 17A is a current-voltage graph of memory cells in which a switching device firing process according to example embodiments is not performed, and FIG. 17B is a current-voltage graph of memory cells in which a switching device firing process described with reference to FIG. 16 is performed. In FIGS. 17A and 17B described above, distribution in FIG. 17B is confirmed to be smaller than that in FIG. 17A. As illustrated in FIGS. 17A and 17B, threshold voltage distribution characteristics of a memory cell array, in which a switching device firing process according to example embodiments is performed, are confirmed to be improved.

According to some example embodiments, each of the switching device firing processes described with reference to FIGS. 4 to 16 may be understood as an independent disclosure, but some example embodiments is not limited thereto. For example, some example embodiments may include performing a switching device firing process by combining two or more firing processes of the switching device firing processes described with reference to FIGS. 4 to 16. A method of forming a semiconductor device including performing a switching device firing process by combining two or more firing processes of the switching device firing processes described with reference to FIGS. 4 to 16 as described above, will be described with reference to FIG. 18.

Figure 18:
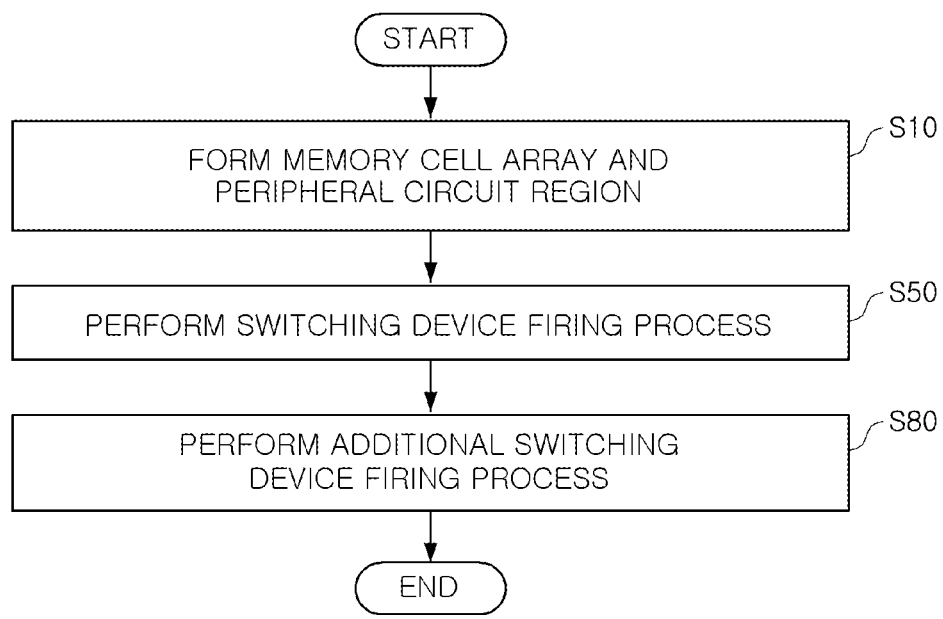
FIG. 18 is a flow chart illustrating a different modified example of a method of forming a semiconductor device according to some example embodiments.

With reference to FIG. 18, a method of forming a semiconductor device according to some example embodiments may include an operation (S10) of forming a memory cell array region and a peripheral circuit region, an operation (S50) of performing a switching device firing process for improving threshold voltage distribution characteristics of switching devices of the memory cell array, and an operation (S80) of performing an additional firing process for improving threshold voltage distribution characteristics of switching devices of the memory cell array.

The operation (S50) of performing a switching device firing process to improve threshold voltage distribution characteristics of switching devices of the memory cell array may be one process of the switching device firing processes described with reference FIGS. 5 to 16.

The operation (S80) of performing an additional firing process to improve threshold voltage distribution characteristics of switching devices of the memory cell array may be one process of the switching device firing processes described with reference to FIGS. 5 to 16, except for a firing process performed in the operation (S50) described above.

In some example embodiments, the switching device firing processes of applying a voltage or a current to the switching devices SW as described with referent to FIGS. 6, 7, 8, 9, 10, 11, 12, 13, 14, 15, and 16, may be performed with the switching device baking process 100 described with reference to FIG. 5. Thus, while the switching device baking (100 in FIG. 5) applying heat to the switching devices SW at about 100° C. to about 150° C. is performed, the switching device firing processes of applying a voltage or a current to the switching devices SW as described with reference to FIGS. 6, 7, 8, 9, 10, 11, 12, 13, 14, 15, and 16 may be performed.

In some example embodiments, after one process of the switching device firing processes as described with reference to FIGS. 6, 7, 8, 9, 10, 11, 12, 13, 14, and 15, is performed, the switching device firing process described with reference to FIG. 16 may be performed before shipment of a product.

In some example embodiments, after the switching device firing processes applying a voltage or a current to the switching devices SW as described with reference to FIGS. 6, 7, 8, 9, 10, 11, 12, 13, 14, and 15 are performed while the switching device baking (100 in FIG. 5) applying heat to the switching devices SW at about 100° C. to about 150° C. is performed, the switching device firing process applying a voltage to the switching devices SW as described with reference to FIG. 16 may be performed before shipment of a product.

In some example embodiments, the switching device firing process may include increasing a level of a current by stages to the target current level Itg, while repeatedly performing a firing process applying a voltage to the switching devices SW, including increasing a level of a voltage from 0V to the target voltage level Vtg in the switching devices SW, two or more times. The increasing a level of a current by stages to the target current level Itg may be the same as the increasing a level of a current by stages for the first period of time Ta as described with reference to FIG. 12.

The switching device firing process of the method of forming a semiconductor device according to some example embodiments may be performed as one process of the process (FIG. 5) of baking the Ovonic threshold switching devices for improving threshold voltage distribution of the switching devices SW, the process (FIGS. 6 to 10, and FIG. 16) of applying a voltage to the Ovonic threshold switching devices, or the process of applying a current to the Ovonic threshold switching devices (FIGS. 11 to 15), or may be performed by combining two or more processes.

Figure 19A:
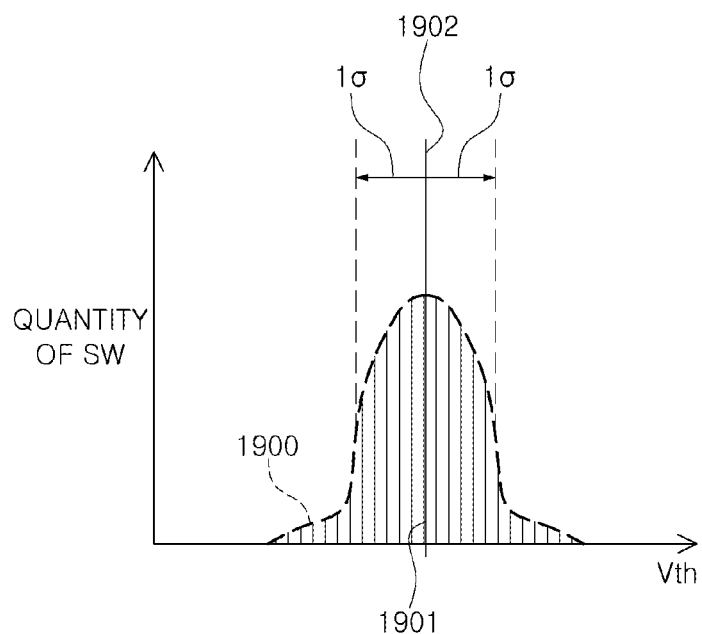
FIG. 19A is a graph illustrating a threshold voltage distribution associated with a plurality of switching devices included in a memory cell array according to some example embodiments.
Figure 19B:
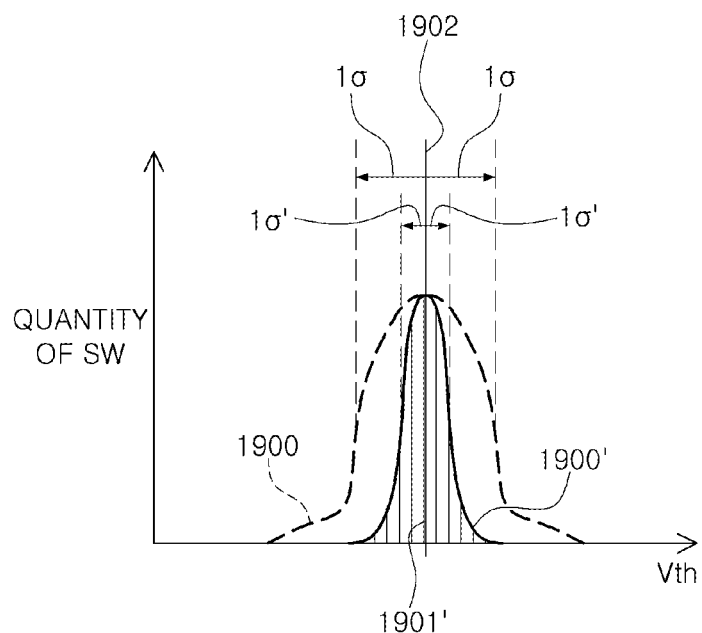
FIG. 19B is a graph illustrating a threshold voltage distribution associated with a plurality of switching devices included in a memory cell array upon which a switching device firing operation has been performed according to some example embodiments.

FIG. 19A is a graph illustrating a threshold voltage distribution associated with a plurality of switching devices included in a memory cell array according to some example embodiments. FIG. 19B is a graph illustrating a threshold voltage distribution associated with a plurality of switching devices included in a memory cell array upon which a switching device firing operation has been performed according to some example embodiments.

Referring back to FIG. 1 and FIGS. 3A-B, in some example embodiments, a memory cell array region MCA may include a plurality of memory cells MC that each includes a switching device SW. Each switching device SW may be associated with a particular threshold voltage Vth, such that the threshold switching device is configured to change resistance based on a magnitude of a voltage applied to the switching device at least meeting the associated threshold voltage.

In some example embodiments, the various switching devices SW in the memory cell array region MCA may have (e.g., be associated with) different threshold voltages Vth. As shown in FIG. 19A, the different threshold voltages Vth associated with the switching devices SW in the memory cell array region MCA may be represented by a distribution 1900 that shows the quantity, proportion, etc. 1901 of switching devices SW that are associated with a given threshold voltage. The distribution 1900 may be a probability density distribution that is approximated by the different quantities of switching devices SW associated with different threshold voltages Vth. As referred to herein, the distribution 1900 may be referred to as a first threshold voltage distribution associated with the switching devices SW of the memory cell array. As shown in FIG. 19A, in some example embodiments, the first threshold voltage distribution 1900 may approximate a normal distribution having a median threshold voltage magnitude 1902 and a standard deviation $1\sigma$.

As shown in FIG. 19B, in some example embodiments, based on performing the switching device firing operation on the switching devices SW of the memory cell array region MCA, the threshold voltage distribution associated with the switching devices SW may be changed, such that at least the variation in differences of threshold voltages across the switching devices of the memory cell array region MCA may be reduced. As a result, and as shown in FIG. 19B, in some example embodiments the threshold voltage distribution associated with the switching devices SW may be changed from the first threshold voltage distribution 1900 to a second threshold voltage distribution 1900', approximating the variation of quantity, proportion, etc. 1901' of switching devices SW that are associated with a given threshold voltage subsequently to the performing of a switching device firing operation on the switching devices SW. The second threshold voltage distribution 1900' is associated with at least a standard deviation $1\sigma'$ that is smaller than the standard deviation $1\sigma$ of distribution 1900. In other words, the variation in threshold voltages across the switching devices SW of the memory cell array region MCA may be reduced. Such a reduction in variation of associated threshold voltages across the switching devices SW of the memory cell array region MCA may be referred to herein as a reduction of the threshold voltage distribution associated with the threshold switching devices.

As set forth above, according to some example embodiments of the present inventive concepts, a threshold switching device firing process for improving threshold voltage distribution characteristics of threshold switching devices and a method of forming a semiconductor device using the same may be provided.

While example embodiments have been shown and described above, it will be apparent to those skilled in the art that modifications and variations could be made without departing from the scope of the present disclosure as defined by the appended claims.

What is claimed is:
1. A method, comprising:
  forming a memory cell array on a semiconductor substrate, the memory cell array including,
    a set of first conductive lines,
    a set of second conductive lines extending substantially perpendicularly to the first conductive lines, and
    a set of memory cells between the first conductive lines and the second conductive lines, the memory cells including data storage elements and threshold switching devices in an amorphous phase, each threshold switching device associated with a particular threshold voltage such that the threshold switching device is configured to change resistance based on a magnitude of a voltage applied on the threshold switching device at least meeting the particular threshold voltage associated with the threshold switching device, respectively; and
  performing a switching device firing operation on the memory cell array while maintaining the threshold switching devices in an amorphous state, such that
    a variation, across the threshold switching devices of the memory cell array, of the threshold voltages associated with the threshold switching devices is reduced, and
    a standard deviation of a threshold voltage distribution that is a distribution of the threshold voltages asso- ciated with the threshold switching devices is reduced, the threshold voltage distribution indicating variation of associated threshold voltage between the threshold switching devices.

2. The method of claim 1, wherein the performing the switching device firing operation includes,
   increasing a magnitude of a voltage applied to the threshold switching devices to a target voltage magnitude,
   maintaining the magnitude of the applied voltage at the target voltage magnitude for a particular period of time, and
   reducing the magnitude of the applied voltage from the target voltage magnitude.

3. The method of claim 2, wherein the target voltage magnitude is greater than a threshold voltage magnitude associated with the threshold switching devices.

4. The method of claim 2, wherein the performing the switching device firing operation includes,
   increasing a magnitude of a voltage applied to the threshold switching devices to a target voltage magnitude over a first period of time,
   maintaining the magnitude of the applied voltage at the target voltage magnitude for a second period of time, and
   dropping the magnitude of the applied voltage from the target voltage magnitude over a third period of time, and
   the first period of time is greater than the third period of time.

5. The method of claim 1, wherein the performing the switching device firing operation includes applying a positive voltage pulse to the threshold switching devices, subsequently to applying a negative voltage pulse to the threshold switching devices.

6. The method of claim 1, wherein,
   the performing the switching device firing operation includes,
      increasing a magnitude of a current applied to a target current magnitude over a first period of time,
      maintaining the magnitude of the applied current at the target current magnitude for a second period of time, and
      dropping the magnitude of the current from the target current magnitude over a third period of time, and
   the first period of time is greater than the third period of time.

7. The method of claim 1, wherein the performing the switching device firing operation includes applying a voltage or a current to the threshold switching devices while the threshold switching devices are heated to a temperature that is greater than room temperature and is associated with a state of non-crystallization being maintained in the threshold switching devices.

8. The method of claim 1, wherein the performing the switching device firing operation includes heating the threshold switching devices to a temperature of about 100° C. to about 150° C.

9. The method of claim 1, wherein the performing the switching device firing operation includes applying a plurality of voltage cycles to the second conductive lines, each voltage cycle including sequentially applying a first voltage and a second voltage to the second conductive lines, a magnitude of the first voltage being greater than a threshold voltage magnitude associated with the switching devices, and a magnitude of the second voltage being lower than the magnitude of the first voltage.

* * * * *